United States Patent
Chiou et al.

(10) Patent No.: US 9,401,433 B1
(45) Date of Patent: Jul. 26, 2016

(54) P-TYPE METAL OXIDE SEMICONDUCTOR MATERIAL AND TRANSISTOR

(71) Applicant: INDUSTRIAL TECHNOLOGY RESEARCH INSTITUTE, Hsinchu (TW)

(72) Inventors: Shan-Haw Chiou, Baoshan Township (TW); Tzu-Chi Chou, Hsinchu (TW); Wen-Hsuan Chao, Zhunan Township (TW); Hsin-Ming Cheng, Toufen (TW); Mu-Tung Chang, Zhubei (TW); Tien-Heng Huang, Tainan (TW); Ren-Fong Cai, Taichung (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 14/982,899

(22) Filed: Dec. 29, 2015

(30) Foreign Application Priority Data

Dec. 4, 2015 (TW) .............................. 104140699 A

(51) Int. Cl.
*H01L 29/00* (2006.01)
*H01L 29/786* (2006.01)
*H01L 29/24* (2006.01)
*H01L 21/02* (2006.01)

(52) U.S. Cl.
CPC ...... *H01L 29/78693* (2013.01); *H01L 21/0237* (2013.01); *H01L 21/02579* (2013.01); *H01L 29/24* (2013.01)

(58) Field of Classification Search
CPC ....................... H01L 21/0237; H01L 21/02579
See application file for complete search history.

(56) References Cited

U.S. PATENT DOCUMENTS

| 6,153,063 | A | * | 11/2000 | Yamada | G11B 7/24 204/192.12 |
| 2001/0041304 | A1 | * | 11/2001 | Uno | G11B 7/243 430/270.13 |
| 2003/0122122 | A1 | | 7/2003 | Iwata | |
| 2004/0235214 | A1 | | 11/2004 | Burgener, II et al. | |
| 2008/0233670 | A1 | | 9/2008 | Choi et al. | |
| 2010/0183500 | A1 | | 7/2010 | Lee | |
| 2011/0007426 | A1 | * | 1/2011 | Qiu | G11B 5/3932 360/313 |
| 2013/0075740 | A1 | | 3/2013 | Correia Fortunato et al. | |

FOREIGN PATENT DOCUMENTS

CN 101840863 A 9/2010

OTHER PUBLICATIONS

Adams et al., "Phase separation during co-deposition of Al—Ge thin films", J. Mater. Res., Mar. 1992, vol. 7, No. 3, pp. 653-666.

(Continued)

*Primary Examiner* — Ngan Ngo
(74) *Attorney, Agent, or Firm* — Birch, Stewart, Kolasch & Birch, LLP

(57) ABSTRACT

A p-type metal oxide semiconductor material is provided, which is composed of $Al_xGe_{(1-x)}O_y$, wherein $0<x\leq0.6$, and $1.0\leq y\leq2.0$. The p-type metal oxide semiconductor material can be applied in a transistor. The transistor may include a gate electrode, a channel layer separated from the gate electrode by a gate insulation layer, and a source electrode and a drain electrode contacting two sides of the channel layer, wherein the channel layer is the p-type metal oxide semiconductor material.

10 Claims, 2 Drawing Sheets

(56) References Cited

OTHER PUBLICATIONS

Dimoulas et al., "Germanium FETs and capacitors with rare earth CeO2/HfO2 gates" IEEE, 2006, 142-145.

Ghosh et al., "Effect of threading dislocation density and dielectric layer on temperature-dependent electrical characteristics of high-hole-mobility metal semiconductor field effect transistors fabricated from wafer-scale epitaxially grown p-type germanium on silicon substrates", Journal of Applied Physics, 2014, vol. 115, pp. 094507-1-094507-12.

Saraswat et al., "Ge based high performance nanoscale MOSFETs", Elsevier, Microelectronic Engineering, 2005, vol. 80, pp. 15-21.

Shibayama et al., "Reduction of Interface States Density due to Post Oxidation with Formation of AlGeO Layer at Al2O3/Ge Interface", Abstract #2248, 224th ECS Meeting, 2013, The Electrochemical Society.

Zhang et al., "High-Mobility Ge pMOSFET With 1-nm EOT Al2O3/GeOx/Ge Gate Stack Fabricated by Plasma Post Oxidation", IEEE Transactions on Electron Devices, Feb. 2012, vol. 59, No. 2, pp. 335-341.

\* cited by examiner

P-TYPE METAL OXIDE SEMICONDUCTOR MATERIAL AND TRANSISTOR

CROSS REFERENCE TO RELATED APPLICATIONS

The present application is based on, and claims priority from, Taiwan Application Serial Number 104140699, filed on Dec. 4, 2015, the disclosure of which is hereby incorporated by reference herein in its entirety.

TECHNICAL FIELD

The technical field relates to a p-type metal oxide semiconductor material, and in particular it relates to a composition and a application of the p-type metal oxide semiconductor material.

BACKGROUND

With the rapid development of display technology, a variety of new-age products and materials have emerged. In these products, transparent displays and related technology have received much attention in recent years due to advantages such as transparency and product interoperability. Among them, a metal oxide semiconductor material can be applied to manufacture transparent thin film transistors. Compared with the thin film transistors manufactured by amorphous silicon, the transparent thin film transistors manufactured by the metal oxide semiconductor material can provide smaller thin film transistor sizes, higher aperture ratios, superior refinement, improved resolution, and higher carrier mobility (for example, electron mobility). Moreover, simple external circuits may be integrated into the display such that the electronic devices may be lighter and thinner and save more power.

However, currently developed transparent metal oxide semiconductor materials are basically n-type, and conventional p-type metal oxide semiconductor material has a more unstable property and a lower reproducibility. Therefore, a novel p-type metal oxide semiconductor material for being collocated with the conventional n-type metal oxide semiconductor materials is called for.

SUMMARY

One embodiment of the disclosure provides a p-type metal oxide semiconductor material, being composed of: $Al_xGe_{(1-x)}O_y$, wherein $0<x\leq0.6$; and $1.0\leq y\leq2.0$.

One embodiment of the disclosure provides a transistor, comprising: a gate electrode; a channel layer separated from the gate electrode by a gate insulation layer; and a source electrode and a drain electrode contacting two sides of the channel layer, wherein the channel layer is a p-type metal oxide semiconductor material composed of $Al_xGe_{(1-x)}O_y$, wherein $0<x\leq0.6$; and $1.0\leq y\leq2.0$.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1A:
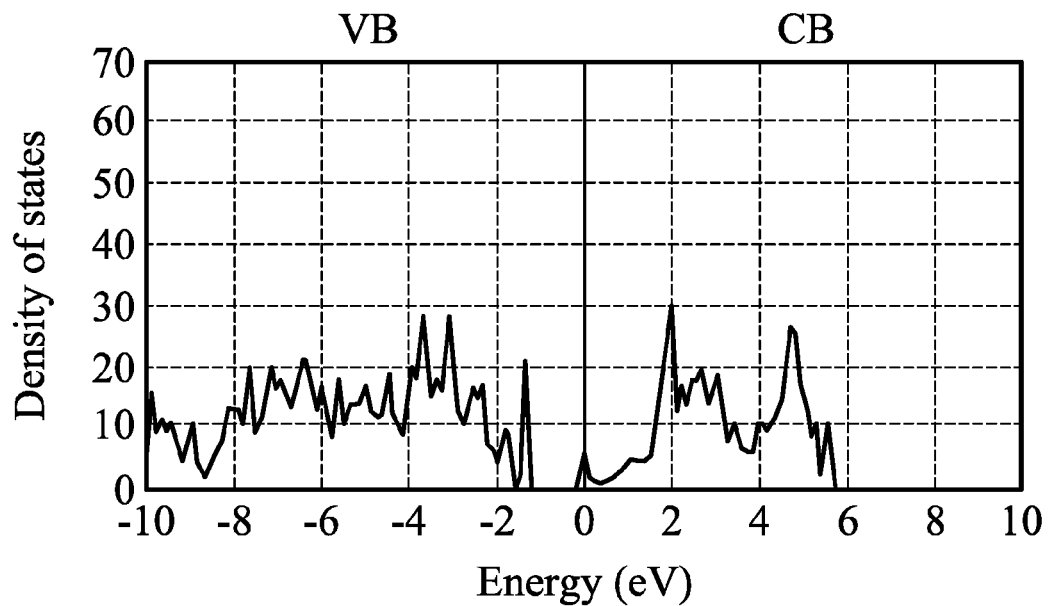
FIG. 1A shows a simulation and calculation result of aluminum substituted germanium oxide $(Al_xGe_{(1-x)}O_1)$ in one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In embodiments of the disclosure, conditions of forming p-type metal oxide semiconductor materials of aluminum substituted germanium oxide (GeO or $GeO_2$) are obtained by preliminary simulation and calculation procedures. Next, the p-type metal oxide semiconductor materials of aluminum substituted germanium oxide are synthesized through deposition or soft chemistry process.

Such simulation and calculation procedures are described as follows. In the disclosure, Vienna Ab-initio Simulation Package (VASP) is involved in the calculation of the variation of density of states (DOS) to energy in the p-type metal oxide semiconductor materials of aluminum substituted germanium oxide, and the results are shown in FIGS. 1A and 1B.

FIG. 1A shows an exemplary density of states versus energy graph of the aluminum substituted germanium oxide (GeO) obtained through the VASP simulation and calculation procedures. Through the simulation and calculation procedures, it is known that the Fermi level of the aluminum substituted germanium oxide shifts to the valence band (VB), therefore the aluminum substituted germanium oxide is a p-type metal oxide semiconductor material. Note that $\frac{1}{16}$ of the Ge atoms in the germanium oxide are designated to be substituted with Al atoms (i.e. $Al_1Ge_{15}O_{16}$). In practice, when carrying out a simulation and calculation procedure, a preliminary calculation of a selected substituent ratio is usually carried out to avoid problems such as excessive amounts of data and a long calculation time. After confirming the preliminary calculation result, a synthesis process is performed with adjusted substituent content to verify the preliminary calculation result. It does not mean that the aluminum substituted germanium oxide (GeO) would not show the properties of a p-type semiconductor beyond the selected substituent ratio.

Figure 1B:
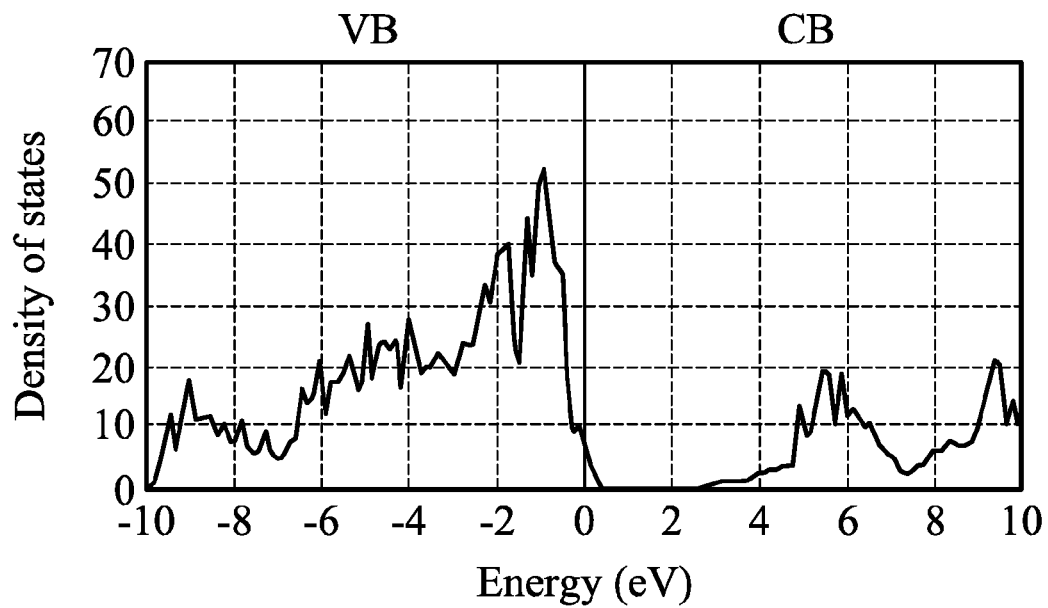
FIG. 1B shows a simulation and calculation result of aluminum substituted germanium oxide $(Al_xGe_{(1-x)}O_2)$ in one embodiment of the disclosure.

FIG. 1B shows an exemplary density of states versus energy graph of the aluminum substituted germanium oxide $(GeO_2)$ obtained through the VASP simulation and calculation procedures. Through the simulation and calculation procedures, it is known that the Fermi level of the aluminum substituted germanium oxide shifts to the valence band (VB), therefore the aluminum substituted germanium oxide is a p-type metal oxide semiconductor material. Note that $\frac{1}{16}$ of the Ge atoms in the germanium oxide are designated to be substituted with Al atoms (i.e. $Al_1Ge_{15}O_{32}$). In practice, when carrying out a simulation and calculation procedure, a preliminary calculation of a selected substituent ratio is usually carried out to avoid problems such as excessive amounts of data and a long calculation time. After confirming the preliminary calculation result, a synthesis process is performed with adjusted substituent content to verify the preliminary calculation result. It does not mean that the aluminum substituted germanium oxide ($GeO_2$) would not show the properties of a p-type semiconductor beyond the selected substituent ratio.

In one embodiment, the aluminum substituted germanium oxide can be formed by sputtering according the above simulation result, which may serve as a p-type metal oxide semiconductor material. First, the work piece to be deposited is put into a sputtering chamber. Thereafter, a gas mixture of oxygen and argon is introduced into the sputtering chamber, and a germanium target and an aluminum target are sputtered to form an aluminum substituted germanium oxide. The oxygen and argon have a molar ratio of 5:95 to 10:90, which is determined by the oxygen content in the p-type metal oxide semiconductor material. In one embodiment, the power of sputtering the germanium target and the aluminum target, the distance between the germanium target and the work piece, and the distance between the aluminum target and the work piece are chosen on the basis of the predetermined Al/Ge ratio. The temperature of the work piece during the sputtering is set to provide the diffusion kinetic energy of the substituent in the semiconductor material, and the temperature also benefits the deposition arrangement.

In another embodiment, an aluminum salt (nitrate or citrate), a germanium salt (nitrate or citrate), and a chelating agent (e.g. tartaric acid) are weighed and mixed in a solution. The solution was then heated to vaporize the solvent in the solution, such that the solution changes into a gel state. The gel is then dried to form a powder. The powder is sintered to oxidize the metal complex to form a metal oxide powder. Related processes such as compression molding, injection molding, cold isostatic press (CIP), and slip casting may be subsequently performed, and a sintering process and a machining process may also be performed to manufacture bulks or targets of the aluminum substituted germanium oxide. The bulk or target can be sputtered (or the like) to form a p-type metal oxide semiconductor material film of aluminum substituted germanium oxide and then be involved in the manufacturing of electronic devices (e.g. transparent displays, transparent field effect transistors, light emitting diodes, or transparent integrated circuit semiconductor devices, or other electronic devices).

The p-type metal oxide semiconductor material formed by the above processes is composed of $Al_xGe_{(1-x)}O_y$, wherein $0<x\leq 0.6$ and $1.0\leq y\leq 2.0$. If x or y is beyond the above range, the aluminum substituted germanium will not have the p-type semiconductor properties. In one embodiment, the p-type metal oxide semiconductor material is amorphous, which has a resistivity of $10^{-3}$ ohm-cm to $10^3$ ohm-cm, a hole mobility of 0.5 $cm^2V^{-1}s^{-1}$ to 75 $cm^2V^{-1}s^{-1}$, and a hole carrier concentration of $10^{13}$ $cm^3$ to $10^{21}$ $cm^{-3}$.

Figure 2:
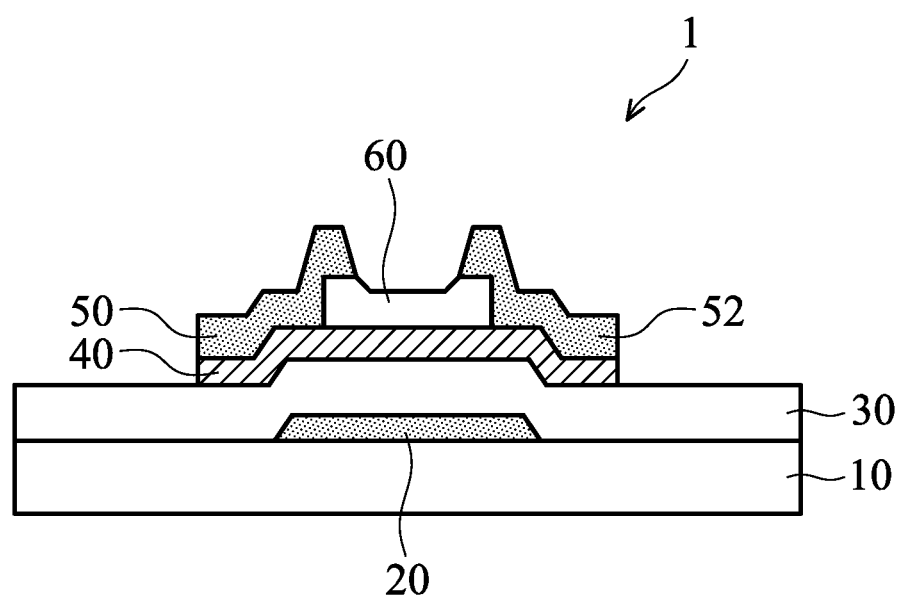
FIG. 2 shows a transistor in one embodiment of the transistor.

In one embodiment, the p-type metal oxide semiconductor material is used in an electronic device such as transistor. As shown in FIG. 2, a gate electrode 20 can be formed on a substrate 10, and a gate insulation layer 30 is then formed on the gate electrode 20. Subsequently, a channel layer 40 can be formed on the gate insulation layer 40 to correspond to the gate electrode 20, and a protection layer 60 can be formed on a middle portion of the channel layer 40. A metal layer is then formed on the protection layer 60 and the channel layer 40, and then patterned to form a source electrode 50 and a drain electrode 52 contacting and overlying two sides of the channel layer 40. As such, a transistor 1 is completed. The material of the channel layer 40 can be the described p-type metal oxide semiconductor material ($Al_xGe_{(1-x)}O_y$). It should be understood that the transistor 1 in FIG. 2 is only for illustration, and the p-type metal oxide semiconductor material ($Al_xGe_{(1-x)}O_y$) can be utilized as a channel layer of other transistors or a p-type semiconductor layer of other electronic devices.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Example 1

The sample was prepared by an off-axis DC reactive magnetron sputtering method for growth aluminum substituted germanium oxide film. The germanium metal target with a purity of 99.999%, a diameter of 3 inches, and a thickness of 6 mm was commercially available from Ultimate materials Technology Co. Ltd. The aluminum metal target with a purity of 99.9999%, a diameter of 2 inches, and a thickness of 6 mm was commercially available from Ultimate materials Technology Co. Ltd. The reaction gas of the sputtering method was a mixture of oxygen ($O_2$, 99.9995%) and argon (Ar, 99.999%) with high purity. First, a glass substrate (Eagle XG, commercially available from Corning Glass) was put into a chuck in a load-lock chamber, and the load-lock chamber was then vacuumed. The glass substrate was then transferred to a major chamber of a sputter, and the major chamber was then vacuumed to $5\times 10^{-6}$ torr, and argon was then introduced into the major chamber by a mass flow controller (MFC) to perform a pre-sputtering step for 10 minutes, thereby removing an oxide and a pollution on surfaces of the germanium target and the aluminum target. After the pre-sputtering, the oxygen and argon were mixed and then introduced into the chamber by the MFC, and a shutter was then opened to start sputtering to obtain amorphous aluminum substituted germanium oxide films ($Al_xGe_{(1-x)}O_1$). The resistivity, the hole mobility, and the hole carrier concentration of the films with different aluminum substituted ratios are listed in Table 1. In Table 1, the aluminum substituted ratios of the films were determined by ICP-Mass. The resistivity, the hole mobility, and the hole carrier concentration of the films were measured by a hall effect measurement system (Nanometrics, HL5500PC). The basic sputtering factors included: the glass substrate and the germanium target had a distance of 7.2 cm, the glass substrate and the aluminum target had a distance of 13.5 cm, the sputtering period was 10 minutes, the total flow of the argon and oxygen was 20 sccm, the oxygen occupies 5% of the gas mixture, the sputtering pressure was 20 mtorr, the substrate temperature during the sputtering was about 380, the sputtering power of the germanium target was 80 W, and the sputtering power of the aluminum target was 0 to 200 W.

TABLE 1

| Aluminum substituted ratio (x) | Resistivity (ohm-cm) | Hole mobility ($cm^2$/V-s) | Hole carrier concentration ($cm^{-3}$) |
| --- | --- | --- | --- |
| 0.00035 | 12.64 | 6.04 | 8.18E+16 |
| 0.00041 | 39.85 | 4.34 | 3.74E+16 |
| 0.00054 | 17.06 | 5.33 | 9.72E+16 |
| 0.03965 | 172.33 | 7.59 | 5.44E+15 |
| 0.09365 | 502.37 | 13.30 | 9.43E+14 |
| 0.23404 | 331.17 | 24.60 | 8.94E+14 |

TABLE 1-continued

| Aluminum substituted ratio (x) | Resistivity (ohm-cm) | Hole mobility (cm²/V-s) | Hole carrier concentration (cm⁻³) |
|---|---|---|---|
| 0.36973 | 0.00 | 6.17 | 3.21E+20 |
| 0.61829 | 0.01 | 1.15 | 1.10E+21 |

As shown in Table 1, the aluminum substituted germanium oxide films ($Al_xGe_{(1-x)}O_1$) were p-type semiconductor materials.

Example 2

Example 2 was similar to Example 1, and the difference in Example 2 was the oxygen occupies 10% of the gas mixture. The other processes and measurements were similar to that in Example 1, and the related description is omitted here. Aluminum substituted germanium oxide films ($Al_xGe_{(1-x)}O_2$) formed in Example 2 were amorphous p-type semiconductor materials. The resistivity, the hole mobility, and the hole carrier concentration of the films with different aluminum substituted ratios are listed in Table 2.

TABLE 2

| Aluminum substituted ratio (x) | Resistivity (ohm-cm) | Hole mobility (cm²/V-s) | Hole carrier concentration (cm⁻³) |
|---|---|---|---|
| 0.00035 | 1554.00 | 35.90 | 1.30E+14 |
| 0.00041 | 1579.67 | 73.63 | 5.72E+13 |
| 0.00054 | 1317.67 | 48.83 | 1.13E+14 |
| 0.03965 | 3520.00 | 7.06 | 5.07E+14 |
| 0.09365 | 3816.67 | 277.67 | 6.61E+12 |
| 0.23404 | 9581.33 | 284.33 | 2.43E+12 |
| 0.25097 | 65.30 | 5.28 | 2.13E+16 |
| 0.36973 | 0.14 | 0.49 | 5.02E+20 |
| 0.61829 | 0.11 | 0.29 | 1.18E+21 |

As shown in Table 2, the aluminum substituted germanium oxide films ($Al_xGe_{(1-x)}O_2$) were p-type semiconductor materials.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A p-type metal oxide semiconductor material, being composed of:

$Al_xGe_{(1-x)}O_y$, wherein 0<x≤0.6; and
1.0≤y≤2.0.

2. The p-type metal oxide semiconductor material as claimed in claim 1, being amorphous.

3. The p-type metal oxide semiconductor material as claimed in claim 1, having a resistivity of $10^{-3}$ ohm-cm to $10^3$ ohm-cm.

4. The p-type metal oxide semiconductor material as claimed in claim 1, having a hole mobility of 0.5 cm²V⁻¹ s⁻¹ to 75 cm²V⁻¹ s⁻¹.

5. The p-type metal oxide semiconductor material as claimed in claim 1, having a hole carrier concentration of $10^{13}$ cm⁻³ to $10^{21}$ cm⁻³.

6. A transistor, comprising:
a gate electrode;
a channel layer separated from the gate electrode by a gate insulation layer; and
a source electrode and a drain electrode contacting two sides of the channel layer,
wherein the channel layer is a p-type metal oxide semiconductor material composed of $Al_xGe_{(1-x)}O_y$,
wherein 0<x≤0.6; and
1.0≤y≤2.0.

7. The transistor as claimed in claim 6, wherein the p-type metal oxide semiconductor material is amorphous.

8. The transistor as claimed in claim 6, wherein the p-type metal oxide semiconductor material has a resistivity of $10^{-3}$ ohm-cm to $10^3$ ohm-cm.

9. The transistor as claimed in claim 6, wherein the p-type metal oxide semiconductor material has a hole mobility of 0.5 cm²V⁻¹ s⁻¹ to 75 cm²V⁻¹ s⁻¹.

10. The transistor as claimed in claim 6, wherein the p-type metal oxide semiconductor material has a hole carrier concentration of $10^{13}$ cm⁻³ to $10^{21}$ cm⁻³.

* * * * *